(12) United States Patent
Lee et al.

(10) Patent No.: US 11,309,436 B2
(45) Date of Patent: Apr. 19, 2022

(54) SEMICONDUCTOR MEMORY DEVICE

(71) Applicant: SK hynix Inc., Icheon-si (KR)

(72) Inventors: Dong Uk Lee, Yongin-si (KR); Hae Chang Yang, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 39 days.

(21) Appl. No.: 16/838,708

(22) Filed: Apr. 2, 2020

(65) Prior Publication Data

US 2021/0143285 A1  May 13, 2021

(30) Foreign Application Priority Data

Nov. 13, 2019 (KR) .................. 10-2019-0145305

(51) Int. Cl.
*H01L 29/812* (2006.01)
*H01L 29/792* (2006.01)
(Continued)

(52) U.S. Cl.
CPC ............ *H01L 29/8124* (2013.01); *G11C 7/18* (2013.01); *H01L 27/1157* (2013.01);
(Continued)

(58) Field of Classification Search
CPC ......... H01L 29/40117; H01L 29/40114; H01L 27/1052; H01L 27/1085; H01L 27/10855; H01L 27/1128; H01L 27/11507; H01L 27/1159; H01L 27/1524; H01L 27/11521; H01L 27/11529; H01L 27/11524; H01L 27/11556; H01L 27/11578; H01L 27/11582; H01L 29/8124; H01L 29/7832; H01L 27/1157; H01L 27/11565; H01L 29/4234–42352; H01L 29/66825–66833; H01L 29/792–7926; H01L 29/1033; H01L 21/28; H01L 21/469; H01L 21/47; H01L 21/475; H01L 21/3212; H01L 21/31116; H01L 21/76877; H01L 21/7687–76883; H01L 21/76802; H01L 21/76805; H01L 21/7681; H01L 21/76811; H01L 21/76813; H01L 21/76814; H01L 21/8239
(Continued)

(56) References Cited

U.S. PATENT DOCUMENTS 7,705,388 B2  4/2010  Iwata
8,344,385 B2  1/2013  Kim et al.
(Continued)

OTHER PUBLICATIONS

"Nanostructure-Based Vacuum Channel Transistor", Electrical and Electronics, NASA Technology Transfer Program, www.nasa.gov, National Aeronautics and Space Administration, Moffett Field, CA, USA.
(Continued)

*Primary Examiner* — Natalia A Gondarenko
(74) *Attorney, Agent, or Firm* — William Park & Associates Ltd.

(57) ABSTRACT

A semiconductor memory device includes, a stack structure, and a channel structure passing through the stack structure, wherein the channel structure includes a channel layer passing through the stack structure and a memory layer surrounding the channel layer, the stack structure includes a gate contacting the channel layer, and the channel layer and the gate form a Schottky junction.

19 Claims, 9 Drawing Sheets

(51) Int. Cl.
  *H01L 27/11565* (2017.01)
  *H01L 27/1157* (2017.01)
  *H01L 27/11582* (2017.01)
  *G11C 7/18* (2006.01)
(52) U.S. Cl.
  CPC .. *H01L 27/11565* (2013.01); *H01L 27/11582* (2013.01); *H01L 29/7926* (2013.01)
(58) Field of Classification Search
  USPC .......................... 257/314, 324; 438/268, 700
  See application file for complete search history.

(56) References Cited

U.S. PATENT DOCUMENTS

| | | | |
|---|---|---|---|
| 8,508,999 | B2 | 8/2013 | Liu et al. |
| 8,724,393 | B2 | 5/2014 | Lue et al. |
| 8,933,501 | B2 | 1/2015 | Makala et al. |
| 9,129,859 | B2 | 9/2015 | Liu et al. |
| 9,496,272 | B2 | 11/2016 | Cernea |
| 10,147,739 | B2 | 12/2018 | Hwang et al. |
| 2012/0327714 | A1 | 12/2012 | Lue |
| 2014/0293702 | A1* | 10/2014 | Dong ................ G11C 16/10 365/185.17 |
| 2017/0098655 | A1* | 4/2017 | Costa .................. H01L 27/1157 |
| 2019/0295956 | A1* | 9/2019 | Kawai ................ H01L 27/1157 |
| 2019/0304997 | A1* | 10/2019 | Shimizu ............ H01L 21/02595 |

OTHER PUBLICATIONS

Jin-Woo Han et al., "Vacuum nanoelectronics: Back to the future?—Gate insulated nanoscale vacuum channel transistor", Applied Physics Letters 100, 213505 (2012), May 23, 2012, American Institute of Physics.

Prof. Krishna Saraswat, "Polycides, Salicides and Metals Gates", Department of Electrical Engineering, Standford University, Stanford, CA, USA.

* cited by examiner

SEMICONDUCTOR MEMORY DEVICE

CROSS-REFERENCE TO RELATED APPLICATION

The present application claims priority under 35 U.S.C. § 119(a) to Korean patent application number 10-2019-0145305 filed on Nov. 13, 2019, in the Korean Intellectual Property Office, the entire disclosure of which is incorporated by herein by reference.

BACKGROUND

1. Technical Field

Various embodiments relate generally to a semiconductor memory device, and more particularly, to a three-dimensional semiconductor memory device.

2. Related Art

Semiconductor memory devices may include memory cells capable of storing data.

Depending on data storage and maintenance method, semiconductor memory devices may be divided into volatile semiconductor memory devices and non-volatile semiconductor memory devices. Volatile memory devices may lose data when power supply is stopped, whereas non-volatile memory devices can retain stored data even in the absence of power supply.

Recently, with the increased use of portable electronic devices, the use of non-volatile semiconductor memory devices is increasing accordingly. For portability and large capacity, highly integrated, large-sized semiconductor memory devices are being required. Three-dimensional semiconductor memory devices have been proposed to increase the integration density and size thereof.

SUMMARY

According to an embodiment, a semiconductor memory device may include, a stack structure, and a channel structure passing through the stack structure, wherein the channel structure includes a channel layer passing through the stack structure and a memory layer surrounding the channel layer, the stack structure includes a source select gate contacting the channel layer, and the channel layer and the source select gate form a Schottky junction.

According to an embodiment, a semiconductor memory device may include a stack structure, a channel structure passing through the stack structure, wherein the channel structure includes a channel layer passing through the stack structure and a memory layer surrounding the channel layer, the stack structure includes a drain select gate contacting the channel layer, and the channel layer and the drain select gate form a Schottky junction.

According to an embodiment, a semiconductor memory device may include a source layer, a stack structure on the source layer, and a channel structure passing through the stack structure, and a bit line electrically coupled to the channel structure, wherein the channel structure includes a channel layer passing through the stack structure and a memory layer surrounding the channel layer, the stack structure includes a source select gate contacting a lower portion of the channel layer and a drain select gate contacting an upper portion of the channel layer, the channel layer and the source select gate form a Schottky junction, and the channel layer and the drain select gate form a Schottky junction.

DETAILED DESCRIPTION

Figure 1A:
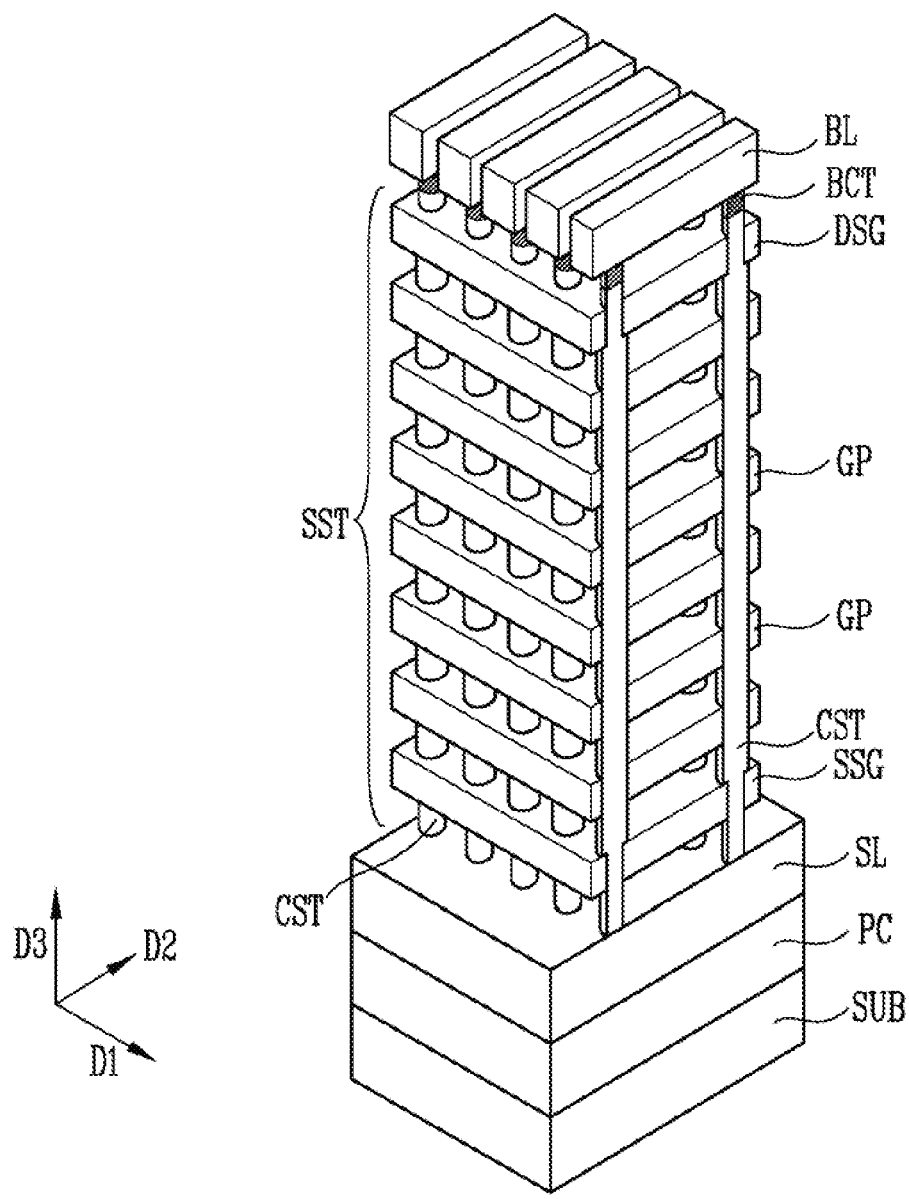
FIG. 1A is a schematic perspective view illustrating a semiconductor memory device according to an embodiment.

Structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component.

Various embodiments of the present disclosure may provide a semiconductor memory device capable of improving operational reliability and a method of manufacturing the same.

Figure 1B:
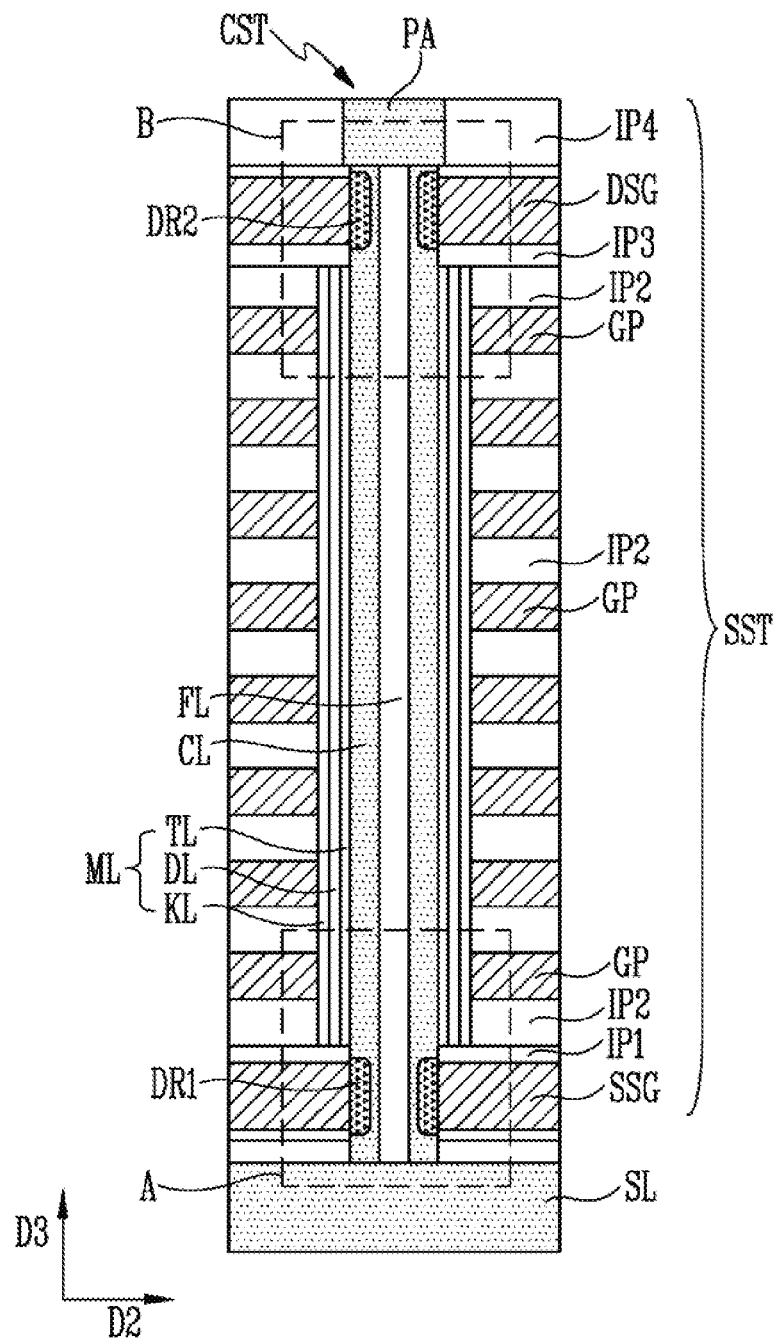
FIG. 1B is a cross-sectional view of a semiconductor memory device shown in FIG. 1A.
Figure 1C:
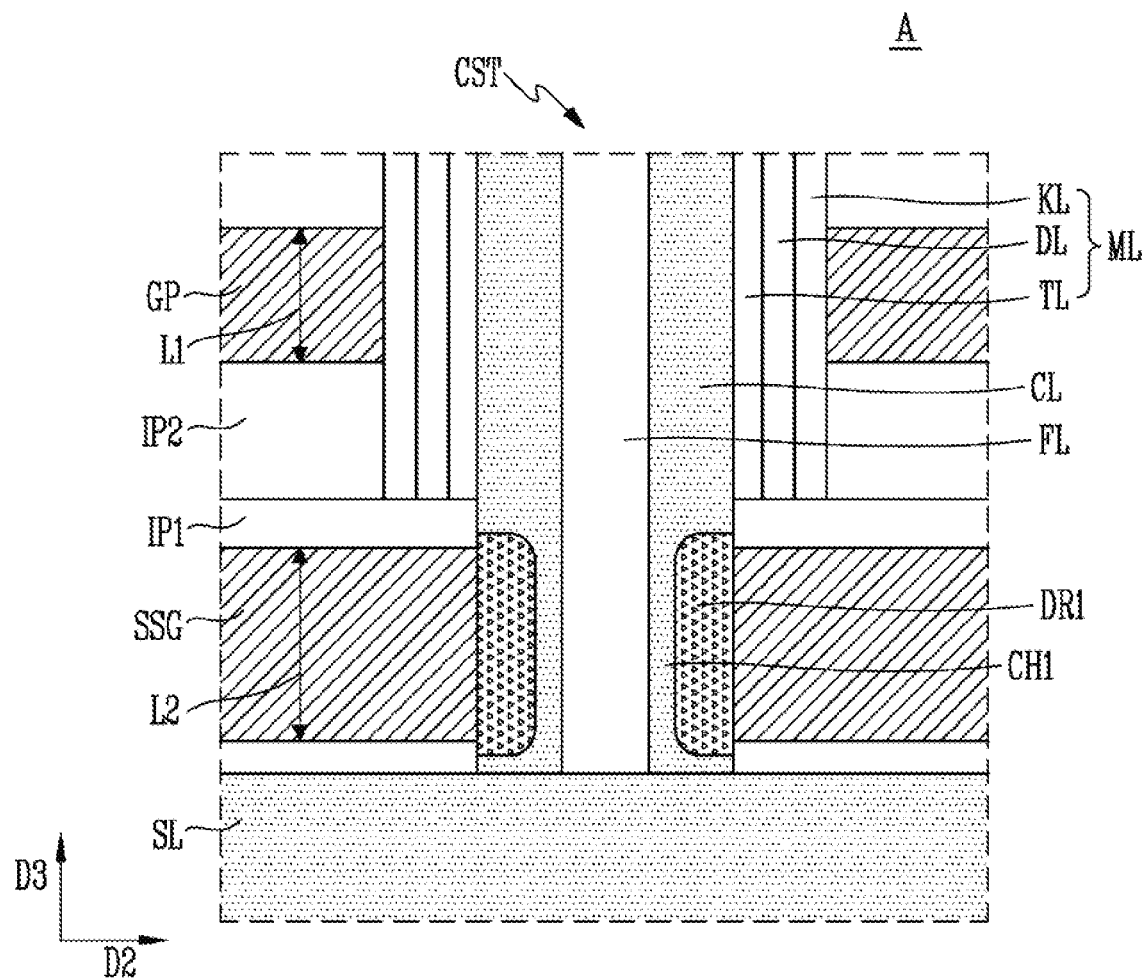
FIG. 1C is an enlarged view of an area A of FIG. 1B.
Figure 1D:
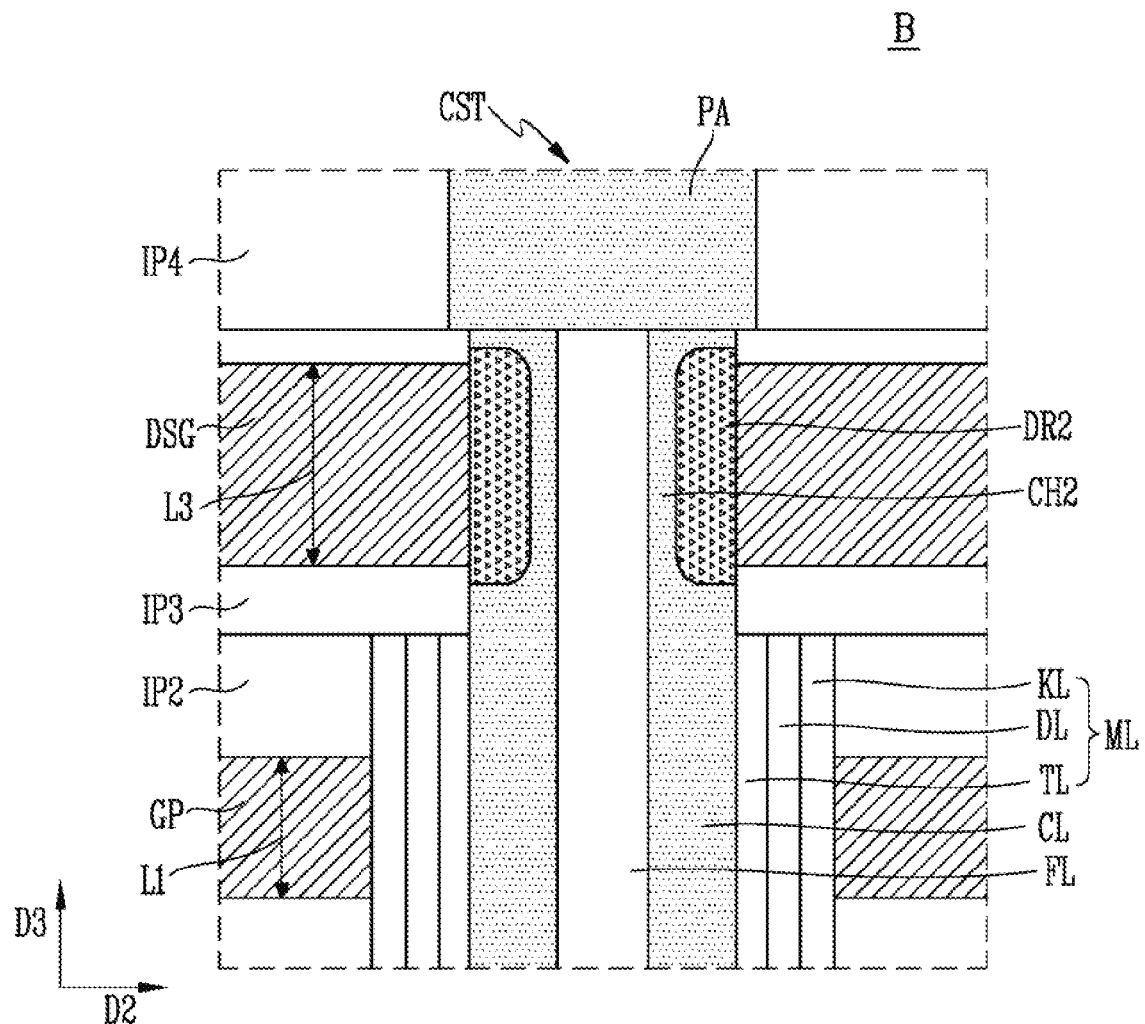
FIG. 1D is an enlarged view of an area B of FIG. 1B.

FIG. 1A is a schematic perspective view illustrating a semiconductor memory device according to an embodiment. FIG. 1B is a cross-sectional view of a semiconductor memory device shown in FIG. 1A. FIG. 1C is an enlarged view of an area A of FIG. 1B. FIG. 1D is an enlarged view of an area B of FIG. 1B.

Referring to FIG. 1A, a semiconductor memory device according to an embodiment may include a substrate SUB, a peripheral circuit structure PC on the substrate SUB, and a memory cell array on the peripheral circuit structure PC.

The substrate SUB may have a shape of a plate extending along a plane defined in a first direction D1 and a second direction D2. The first direction D1 and the second direction D2 may be perpendicular to each other. The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The peripheral circuit structure PC may include NMOS transistors and PMOS transistors, a resistor, and a capacitor which are electrically coupled to the memory cell array. The NMOS transistors, the PMOS transistors, the resistor, and the capacitor may serve as elements forming a row decoder, a column decoder, a page buffer and an input/output control circuit.

The peripheral circuit structure PC may be disposed between the memory cell array and the substrate SUB. For example, the memory cell array may overlap with the peripheral circuit structure PC in a perpendicular direction (i.e., a third direction D3). The third direction D3 may be perpendicular to a top surface of the substrate SUB. The third direction D3 may be perpendicular to the first direction D1 and the second direction D2. When the memory cell array is located on the peripheral circuit structure PC, the area of the memory cell array and the peripheral circuit structure PC over the substrate SUB may be reduced. However, contrary to FIG. 1, the peripheral circuit structure PC might not overlap with the memory cell array. In other words, the peripheral circuit structure PC and the memory cell array may be separated from each other in a plane view (i.e., first direction D1 or second direction D2).

The memory cell array may include a source layer SL, bit lines BL, bit line contacts BCT, a stack structure SST, and channel structures CST.

The source layer SL may serve as a source line and be provided on the peripheral circuit structure PC. The source layer SL may include a doped semiconductor layer. For example, the source layer SL may include N type doped polysilicon at a high concentration.

The stack structure SST may be provided on the source layer SL. The stack structure SST may include a source select gate SSG, gate patterns GP, a drain select gate DSG and insulating patterns (not shown). The source select gate SSG, the gate patterns GP, the drain select gate DSG, and the insulating patterns may be stacked in the third direction D3. For example, the insulating patterns may include a silicon oxide.

The source select gate SSG may be disposed adjacent to the source layer SL. The drain select gate DSG may be disposed adjacent to the bit line BL. The gate patterns GP may be disposed between the source select gate SSG and the drain select gate DSG. The source select gate SSG, the gate patterns GP, and the drain select gate DSG may be separated from each other in the third direction D3. The insulating patterns may be disposed between the source select gate SSG, the gate patterns GP, and the drain select gate DSG.

The source select gate SSG may serve as a source select line and the drain select gate DSG may serve as a drain select line. The gate patterns GP may serve as word lines.

The channel structures CST may extend in the third direction D3 and pass through the stack structure SST. The channel structures CST may contact the source layer SL. The channel structures CST may be electrically coupled to the source layer SL. The channel structures CST may have a pillar shape.

Bit lines BL may be provided over the stack structure SST. The bit lines BL may extend in the second direction D2. The bit lines BL may be spaced apart from each other in the first direction D1. The bit lines BL may be electrically coupled to the channel structures CST. The bit lines BL may include a conductive material. For example, the bit lines BL may include tungsten, aluminum, or copper.

The bit line contacts BCT may be provided between the bit lines BL and the channel structures CST. Each of the bit line contacts BCT may electrically couple the bit line BL and the channel structure CST. The bit line contacts BCT may include a conductive material. For example, the bit line contacts BCT may include tungsten, aluminum, or copper.

Referring to FIGS. 1B, 1C, and 1D, the channel structure CST may include a filling layer FL, a channel layer CL and a memory layer ML. The filling layer FL may have a shape of a pillar. The channel layer CL may have a cylindrical shape surrounding an outer wall of the filling layer FL. The memory layer ML may have a cylindrical shape surrounding an outer wall of the channel layer CL. The memory layer ML may include a tunnel layer TL, a storage layer DL and a blocking layer KL. The tunnel layer TL may have a cylindrical shape surrounding an outer wall of the channel layer CL. The storage layer DL may have a cylindrical shape surrounding an outer wall of the tunnel layer TL. The blocking layer KL may have a cylindrical shape surrounding an outer wall of the storage layer DL.

The filling layer FL and the channel layer CL may pass through the source select gate SSG, the gate patterns GP and the drain select gate DSG. The memory layer ML may pass through the gate patterns GP. A lowermost portion of the memory layer ML may be located at a higher level than an uppermost portion of the source select gate SSG. An uppermost portion of the memory layer ML may be located at a lower level than a lowermost portion of the drain select gate DSG. The memory layer ML may be disposed between the source select gate SSG and the drain select gate DSG.

For example, the filling layer FL may include a silicon oxide. For example, the channel layer CL may include polysilicon. A portion of the channel layer CL may include an N type dopant. For example, a portion of the channel layer CL may include N type doped polysilicon. The tunnel layer TL may include an oxide enabling charge tunneling. The tunnel layer TL may have a first thickness allowing for charge tunneling. For example, the tunnel layer TL may include a silicon oxide. The blocking layer KL may include on oxide capable of blocking charge movement. The blocking layer KL may have a second thickness capable of blocking charge movement. The second thickness may be greater than the first thickness. For example, the blocking layer KL may include a silicon oxide. The storage layer DL may include a material in which charges are trapped. For example, the storage layer DL may include at least one of nitride, silicon, a phase change material, and nano dots.

The channel structure CST may further include a conductive pad PA. The conductive pad PA may contact upper portions of the filling layer FL and the channel layer CL. The conductive pad PA may contact the bit line contact BCT. The conductive pad PA may be located between the bit line BL and the channel layer CL. For example, the conductive pad PA may include N type doped polysilicon at a high concentration.

The stack structure SST may include a first insulating pattern IP1, second insulating patterns IP2 on the first insulating pattern IP1, a third insulating pattern IP3 on the second insulating patterns IP2, and a fourth insulating pattern IP4 on the third insulating pattern IP3.

The source select gate SSG may be disposed in the first insulating pattern IP1. The gate patterns GP may be disposed between the second insulating patterns IP2. The drain select gate DSG may be disposed in the third insulating pattern IP3. The conductive pad PA may be disposed in the fourth insulating pattern IP4. For example, each of the first, second, third and fourth insulating patterns IP1, IP2, IP3, and IP4 may include a silicon oxide.

The gate patterns GP of the stack structure SST may contact the blocking layer KL of the channel structure CST. For example, the gate patterns GP may include a gate conductive layer. For example, the gate conductive layer may include at least one of a doped silicon layer, a metal silicide layer, tungsten, nickel and cobalt, and may serve as a word line coupled to a memory cell. The gate patterns GP may further include a barrier layer surrounding the gate conductive layer. For example, the barrier layer may include at least one of a titanium nitride and a tantalum nitride.

The source select gate SSG of the stack structure SST may contact an outer wall of a lower portion of the channel layer CL. The source select gate SSG may be in Schottky contact with the channel layer CL. In other words, the source select gate SSG and the channel layer CL may constitute a Schottky diode. The source select gate SSG may include a metal or a metal silicide. As used herein, the term 'work function' refers to the energy required to release one electron from the surface of a specific material in a vacuum. Different materials may be have different work functions. For example, the work function of Zn and the work function of Cu may be different from each other. A work function of the material included in the source select gate SSG may be greater than that of the material included in the channel layer CL. For example, the source select gate SSG may include at least one of Fe, Cr, Mo, Cu, Co, Au, Pd, Ni, Pt, CoSi, NiSi, WSi and PtSi.

As the source select gate SSG and the channel layer CL form a Schottky junction, a first depletion region DR1 may be formed in the channel layer CL. The first depletion region DR1 may be formed in the lower portion of the channel layer CL. The first depletion region DR1 may be a portion of the channel layer CL. The first depletion region DR1 may have a ring shape. The first depletion region DR1 may contact the source select gate SSG. The size of the first depletion region DR1 may be increased or decreased depending on a voltage applied to the source select gate SSG.

A portion of the channel layer CL located between the first depletion region DR1 and the filling layer FL may be defined as a first channel CH1. The first channel CH1 may electrically couple portions of the channel layer CL which are located above and below the first depletion region DR1. In an embodiment, the first channel CH1 may electrically couple portions of the channel layer CL which are located above and below the first depletion region DR1 (i.e., in the third direction D3).

The drain select gate of the stack structure SST may contact an outer wall of an upper portion of the channel layer CL. The drain select gate DSG may be in Schottky contact with the channel layer CL. In other words, the drain select gate DSG and the channel layer CL may constitute a Schottky diode. The drain select gate DSG may include a metal or a metal silicide. A work function of the material included in the drain select gate DSG may be greater than that of the material included in the channel layer CL. For example, the drain select gate DSG may include at least one of Fe, Cr, Mo, Cu, Co, Au, Pd, Ni, Pt, CoSi, NiSi, WSi and PtSi.

As the drain select gate DSG and the channel layer CL form a Schottky junction, a second depletion region DR2 may be formed in the channel layer CL. The second depletion region DR2 may be formed in an upper portion of the channel layer CL. The second depletion region DR2 may be a portion of the channel layer CL. The second depletion region DR2 may have a ring shape. The second depletion region DR2 may contact the drain select gate DSG. The size of the second depletion region DR2 may be increased or decreased depending on a voltage applied to the drain select gate DSG.

A portion of the channel layer CL located between the second depletion region DR2 and the filling layer FL may be defined as a second channel CH2. The second channel CH2 may electrically couple portions of the channel layer CL which are located above and below the second depletion region DR2. In an embodiment, the second channel CH2 may electrically couple portions of the channel layer CL which are located above and below the second depletion region DR2 (i.e., in the third direction D3).

A length of the gate pattern GP in a vertical direction (i.e., third direction D3) may be defined as a first length L1. A length of the source select gate SSG in a vertical direction (i.e., third direction D3) may be defined as a second length L2. A length of the drain select gate DSG in a vertical direction (i.e., third direction D3) may be defined as a third length L3. The second length L2 may be greater than the first length L1. The third length L3 may be greater than the first length L1. The third length L3 may be greater than the second length L2.

Figure 2A:
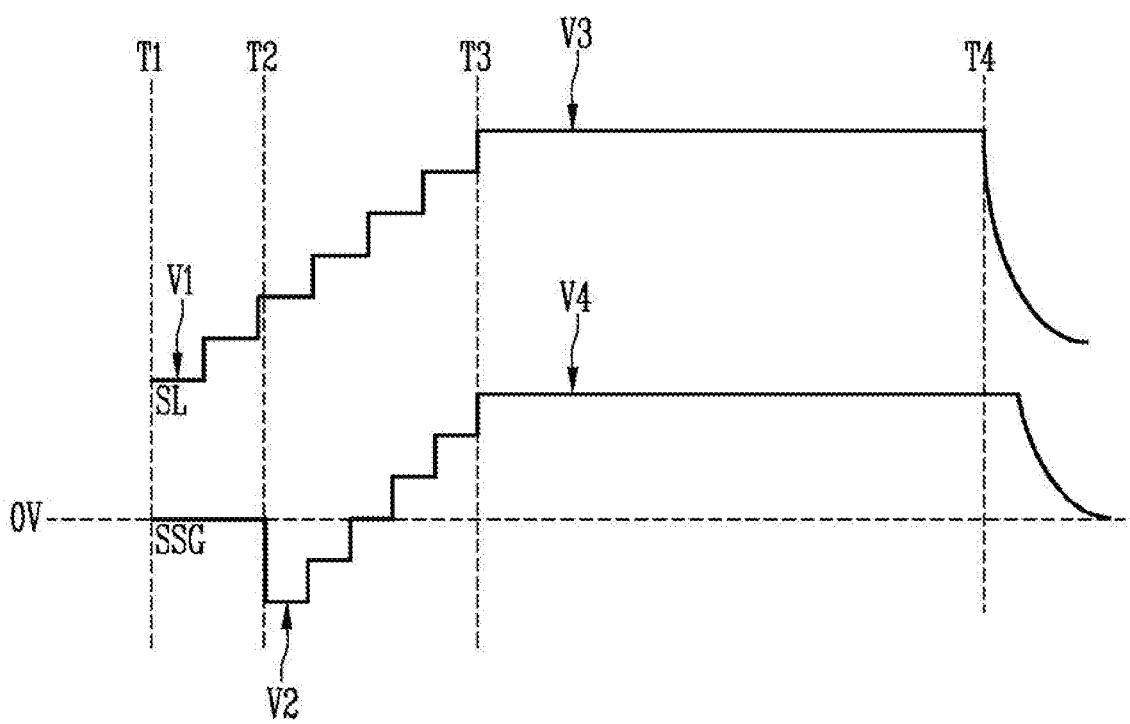
FIG. 2A is a timing diagram illustrating a method of operating a semiconductor memory device according to an embodiment.
Figure 2B:
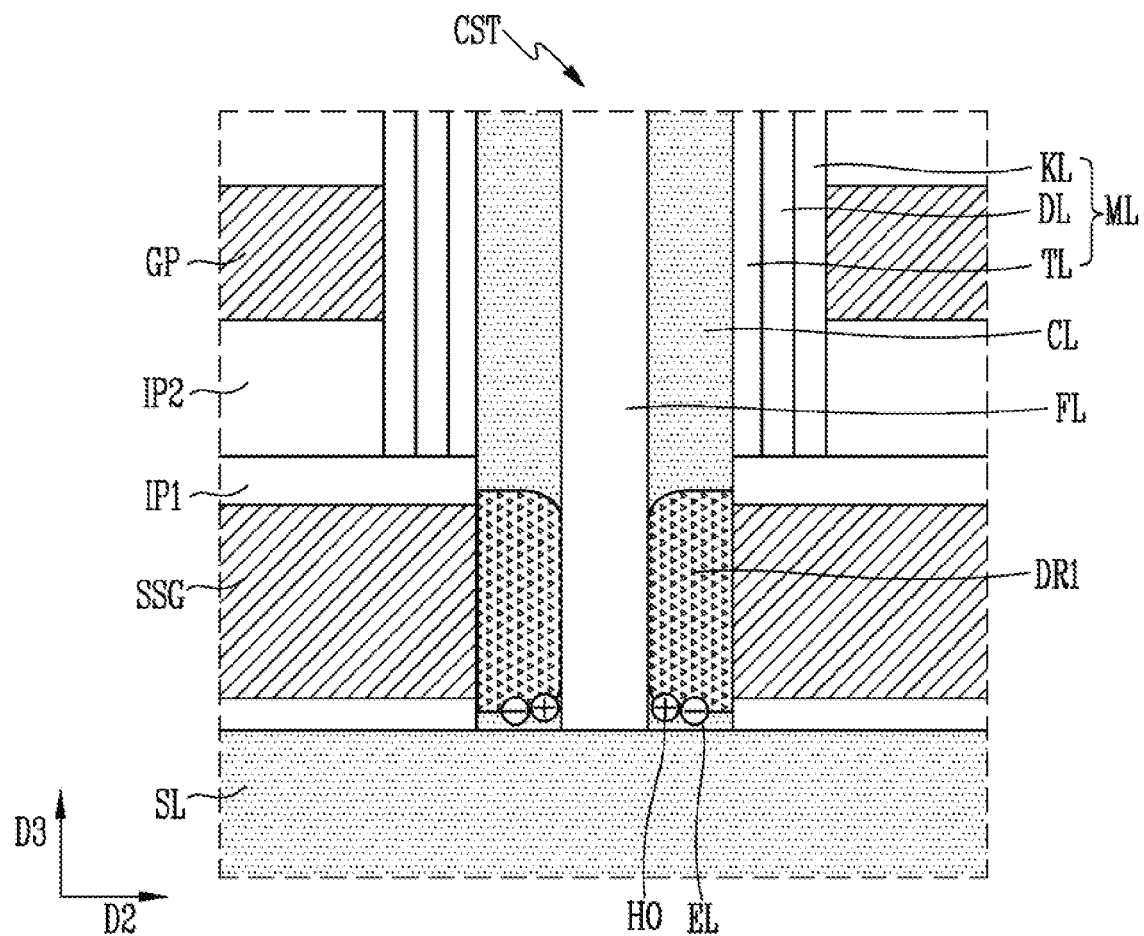
FIGS. 2B and 2C are cross-sectional views illustrating a method of operating a semiconductor memory device according to an embodiment.
Figure 2C:
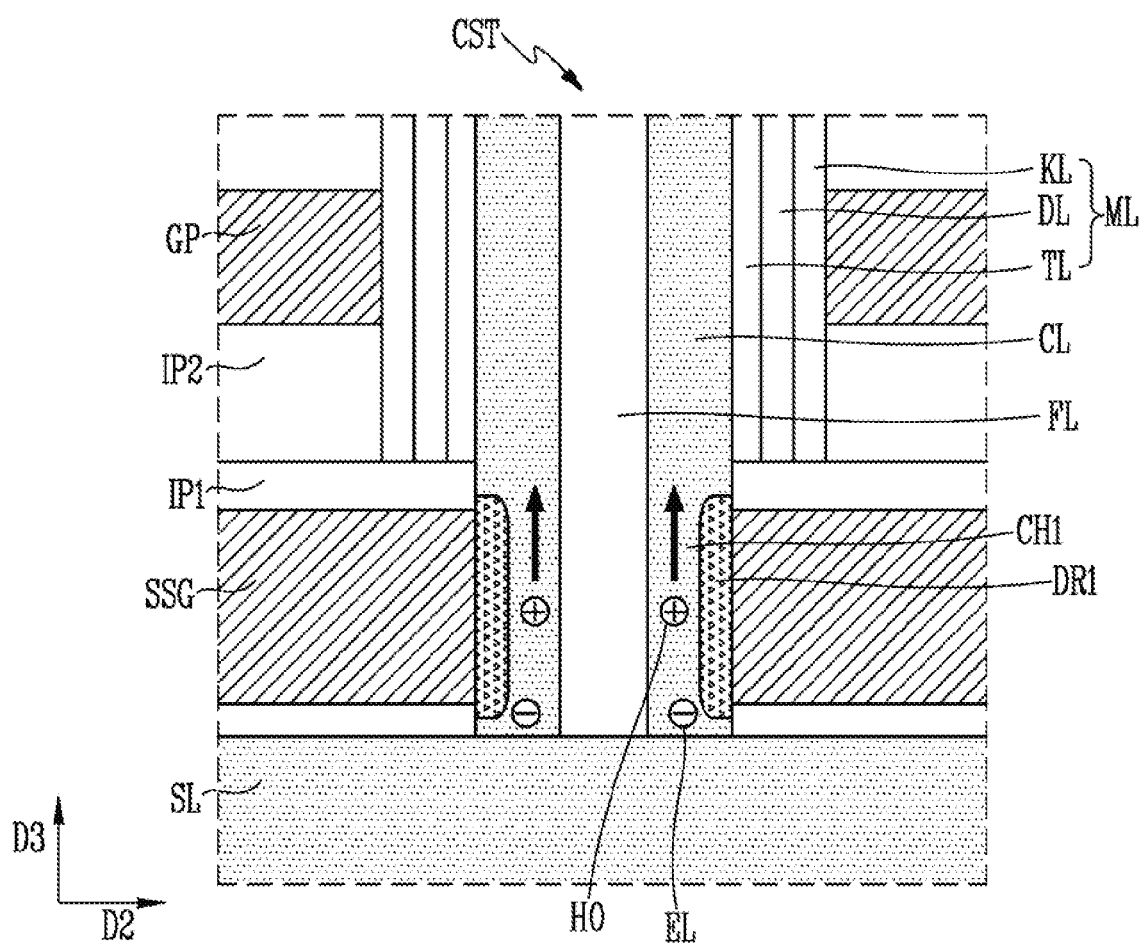

FIG. 2A is a timing diagram illustrating a method of operating a semiconductor memory device according to an embodiment. FIGS. 2B and 2C are cross-sectional views illustrating a method of operating a semiconductor memory device according to an embodiment.

For convenience of explanation, same reference numerals denote the components described with reference to FIGS. 1A to 1D, and duplicate descriptions of the same components are omitted.

Referring to FIGS. 2A to 2C, an erase operation of a semiconductor memory device according to an embodiment may be performed by applying voltages to the source select gate SSG and the source layer SL. By applying voltages to the source select gate SSG and the source layer SL, a gate induced drain leakage (GIDL) current may be generated, and an erase operation may be performed.

The erase operation will be described below.

First Period (T1-T2)

When a first period (T1-T2) starts (T1), a first voltage V1 may be applied to the source layer SL and the source select gate SSG may be floated. The first voltage V1 may be a positive voltage. During the first period (T1-T2), the voltage applied to the source layer SL may be gradually increased.

Second Period (T2-T3)

When a second period (T2-T3) starts (T2), a second voltage V2 may be applied to the source select gate SSG. The second voltage V2 may be a negative voltage. By applying the second voltage V2, the first depletion region DR1, which is part of the channel layer CL, may be enlarged. As the size of the first depletion region DR1 is increased, the first depletion region DR1 may contact the filling layer FL and the first channel CH1 may be closed.

When the first channel CH1 is closed, the portions of the channel layer CL which are located above and below the first depletion region DR1 may be electrically insulated from each other. In other words, the source layer SL and the bit line BL may be electrically separated from each other. The second voltage V2 may cause electrons EL and holes HO to be formed between the first depletion region DR1 and the source layer SL (please refer to FIG. 2B). Each of the electrons EL and each of the holes HO may make a pair. The electrons EL and the holes HO may be formed by GIDL. The electrons EL and the holes HO may be continuously formed during the second period (T2-T3). During the second period (T2-T3), a voltage applied to the source layer SL may be gradually increased. During the second period (T2-T3), a voltage applied to the source select gate SSG may be gradually increased. During the second period (T2-T3), the voltage applied to the source select gate SSG may change from a negative voltage to a positive voltage.

When the voltage applied to the source select gate SSG changes from the negative voltage to the positive voltage, the size of the first depletion region DR1 may be reduced (please refer to FIG. 2C). As the size of the first depletion region DR1 is reduced, the first channel CH1 may be re-opened. As the first channel CH1 is opened, the portions of the channel layer CL which are located above and below the first depletion region DR1 may be electrically coupled to each other, and the holes HO may move toward the gate patterns GP along the channel layer CL (please refer to FIG. 2C).

Third Period (T3-T4)

During a third period (T3-T4), a third voltage V3 may be continuously applied to the source layer SL, and a fourth voltage V4 may be continuously applied to the source select gate SSG. During the third period (T3-T4), a memory cell may be erased by the holes HO moved along the channel layer CL.

As such, an erase operation may be performed by the voltages applied to the source select gate SSG and the source layer SL. An erase operation may be performed by applying voltages to the drain select gate DSG and the bit line BL in a similar manner that performs the erase operation by applying voltages to the source select gate SSG and the source layer SL. By applying a voltage to the drain select gate DSG similarly to the voltage applied to the source select gate SSG and applying a voltage to the bit line BL similarly to the voltage applied to the source layer SL, an erase operation may be performed.

According to an embodiment, the channel layer CL and the source select gate SSG may form a Schottky junction and the channel layer CL and the drain select gate DSG may form a Schottky junction, so that a semiconductor memory device may have a relatively high operating speed.

Figure 3A:
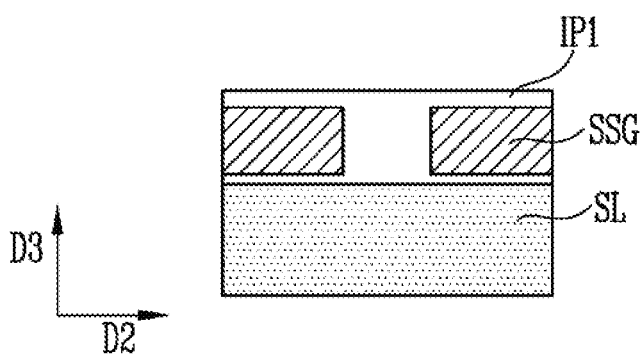
FIGS. 3A and 3B are cross-sectional views illustrating a method of manufacturing a semiconductor memory device according to an embodiment.
Figure 3B:
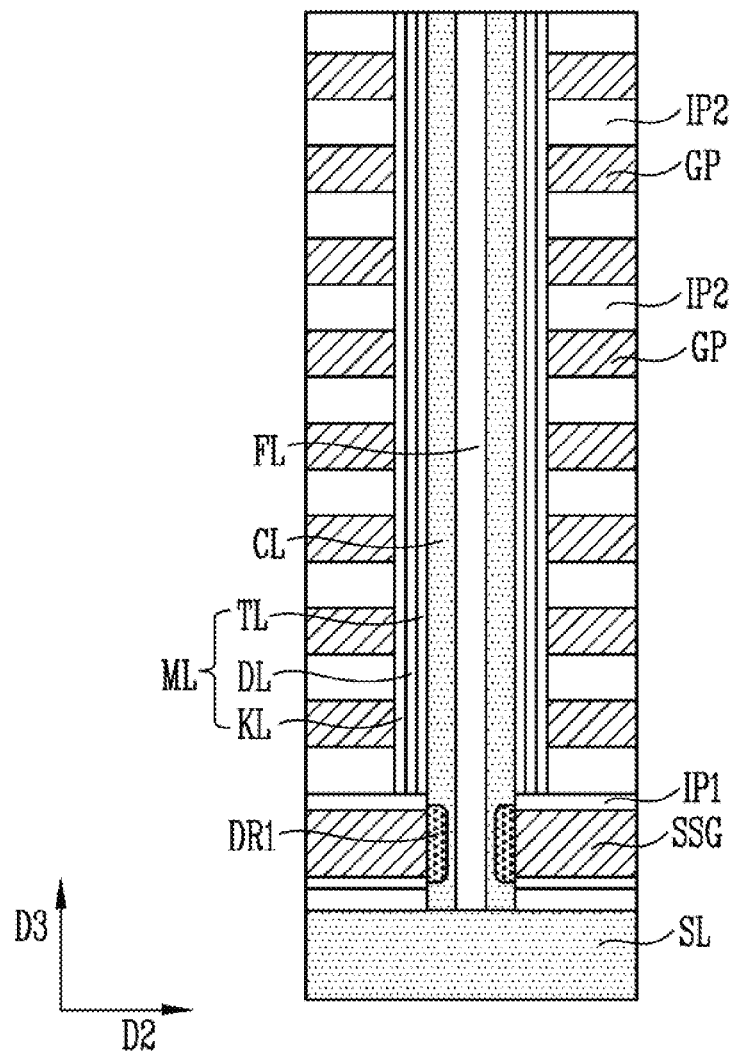

FIGS. 3A and 3B are cross-sectional views illustrating a method of manufacturing a semiconductor memory device according to an embodiment.

For convenience of explanation, same reference numerals denote the components described with reference to FIGS. 1A to 1D, and duplicate descriptions of the same components are omitted.

Referring to FIG. 3A, the first insulating pattern IP1 and the source select gate SSG may be formed on the source layer SL. The source select gate SSG may be formed in the first insulating pattern IP1.

Referring to FIG. 3B, the second insulating patterns IP2 and sacrificial patterns (not shown) may be formed over the first insulating pattern IP1. The sacrificial patterns may be disposed between the second insulating patterns IP2. The sacrificial patterns may include a silicon nitride.

Subsequently, the channel structure CST may pass through the second insulating patterns IP2, the sacrificial patterns, the first insulating patterns IP1 and the source select gate SSG. The memory layer ML of the channel structure CST may pass through the second insulating patterns IP2 and the sacrificial patterns. The channel layer CL and the filling layer FL of the channel structure CST may pass through the second insulating patterns IP2, the sacrificial patterns, the source select gate SSG and the first insulating pattern IP1. The first depletion region DR1 contacting the source select gate SSG may be formed in the channel layer CL.

After the channel structure CST is formed, the sacrificial patterns may be removed and the gate patterns GP may be formed.

The third insulating pattern IP3 and the drain select gate DSG may be formed on the second insulating pattern IP2 (please refer to FIG. 1B). The drain select gate DSG may be formed in the third insulating pattern IP3.

Subsequently, the channel layer CL and the filling layer FL may be formed through the third insulating pattern IP3 and the drain select gate DSG (please refer to FIG. 1B). The second depletion region DR2 contacting the drain select gate DSG may be formed in the channel layer CL.

Subsequently, the fourth pattern IP4 and the conductive pad PA may be formed on the third insulating pattern IP3.

Figure 4:
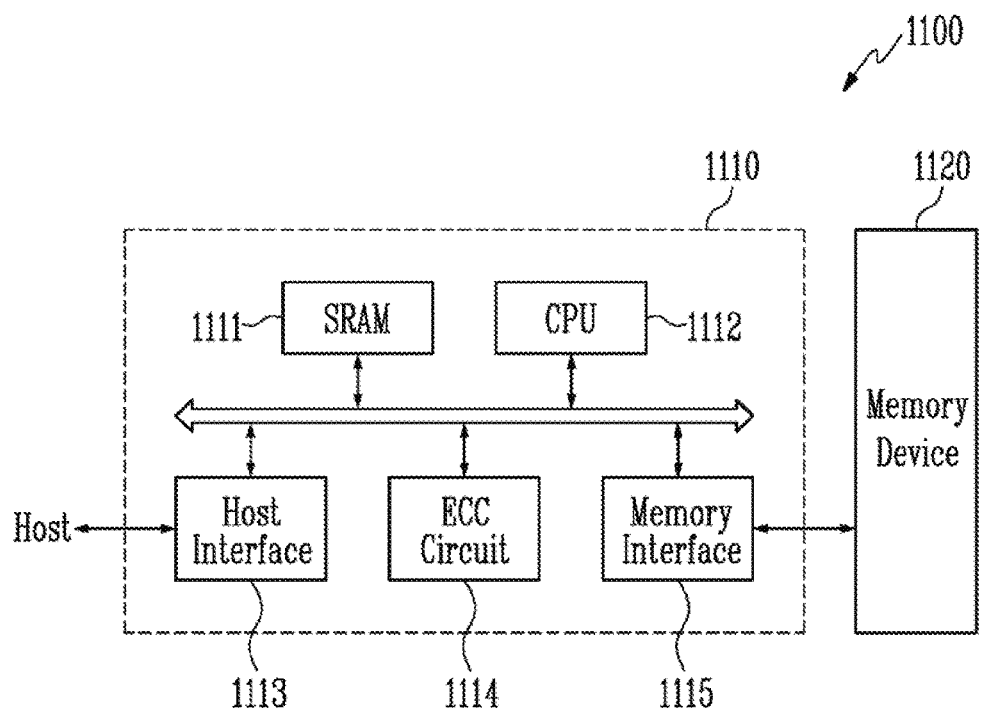
FIG. 4 is a block diagram illustrating the configuration of a memory system according to embodiment of the present disclosure.

FIG. 4 is a block diagram illustrating the configuration of a memory system 1100 according to an embodiment of the present disclosure.

Referring to FIG. 4, the memory system 1100 according to an embodiment of the present disclosure may include a memory device 1120 and a memory controller 1110.

The memory device 1120 may include the structures described with reference to FIGS. 1A to 1D. The memory device 1120 may be a multi-chip package composed of a plurality of flash memory chips.

The memory controller 1110 may be configured to control the memory device 1120 and include a static random access memory (SRAM) 1111, a CPU 1112, a host interface 1113, an error correction code (ECC) circuit 1114, and a memory interface 1115. The SRAM 1111 may serve as an operation memory of the CPU 1112, the CPU 1112 may perform a control operation for data exchange of the memory controller 1110, and the host interface 1113 may include a data exchange protocol of a host accessing the memory system 1100. In addition, the ECC circuit 1114 may detect and correct errors included in the data read from the memory device 1120, and the memory interface 1115 may perform interfacing with the memory device 1120. The memory controller 1110 may further include a read-only memory (ROM) that stores code data to interface with the host.

The memory system 1100 having the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer Small Interface (SCSI), Enhanced Small Disk Interface (ESDI), and Integrated Drive Electronics (IDE).

Figure 5:
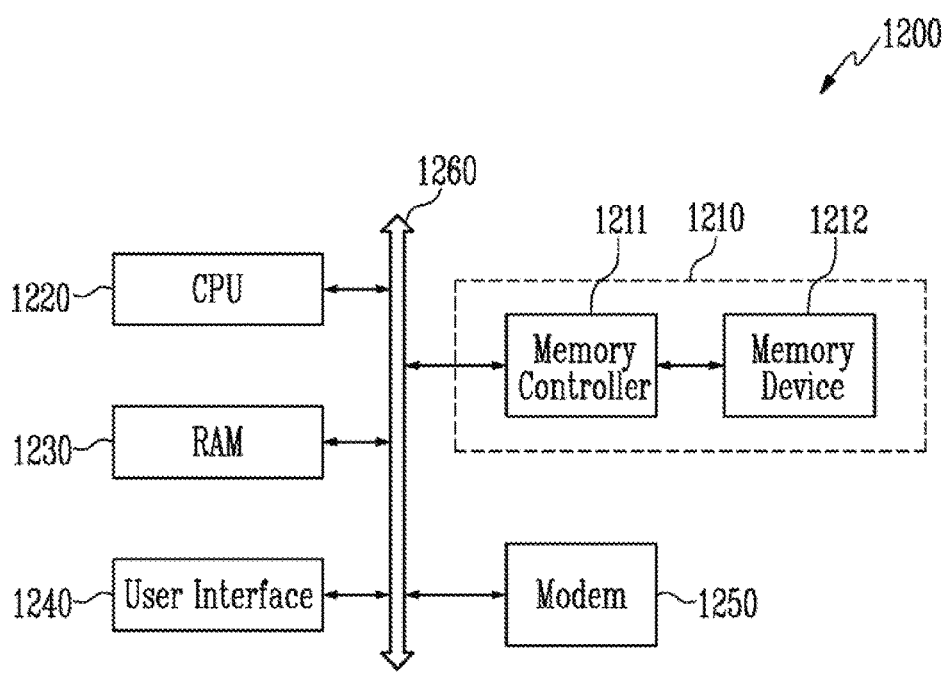
FIG. 5 is a block diagram illustrating the configuration of a computing system according to embodiment of the present disclosure.

FIG. 5 is a block diagram illustrating the configuration of a computing system 1200 according to an embodiment of the present disclosure.

Referring to FIG. 5, the computing system 1200 may include a CPU 1220, Random Access Memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, an application chipset, a camera image processor (CIS), a mobile DRAM, and the like may be further included.

As described above in connection with FIG. 4, the memory system 1210 may include a non-volatile memory 1212 and a memory controller 1211.

In a semiconductor memory device according to embodiments of the present disclosure, a drain select line and a source select line may be in Schottky contact with a channel layer. Accordingly, an operating speed and operational reliability of a semiconductor memory device according to embodiments of the present disclosure may be improved.

It will be apparent to those skilled in the art that various modifications can be made to any of the above-described embodiments of the present disclosure without departing from the spirit or scope of the disclosure. Thus, it is intended that the present disclosure cover all such modifications provided they come within the scope of the appended claims and their equivalents.

What is claimed is:

1. A semiconductor memory device, comprising:
   a stack structure; and
   a channel structure passing through the stack structure,
   wherein the channel structure includes a channel layer passing through the stack structure and a memory layer surrounding the channel layer,
   the stack structure includes a source select gate contacting the channel layer, and
   the channel layer and the source select gate configured to form a Schottky junction,
   wherein the source select gate and the channel layer are in direct contact with each other.

2. The semiconductor memory device of claim 1, further comprising:
   a source layer, the stack structure on the source layer.

3. The semiconductor memory device of claim 1, wherein a work function of a material included in the channel layer is greater than a work function of a material included in the source select gate.

4. The semiconductor memory device of claim 3, wherein the source select gate includes at least one of iron (Fe), chromium (Cr), molybdenum (Mo), copper (Cu), cobalt (Co), gold (Au), palladium (Pd), nickel (Ni), platinum (Pt), cobalt monosilicide (CoSi), nickel monosilicide (NiSi), tungsten monosilicide (WSi) and platinum monosilicide (PtSi).

5. The semiconductor memory device of claim 1, wherein a depletion region contacting the source select gate is formed in the channel layer.

6. The semiconductor memory device of claim 1, wherein the channel layer includes N type doped polysilicon.

7. The semiconductor memory device of claim 1,
   wherein the stack structure further includes a drain select gate contacting the channel layer, and
   wherein the channel layer and the drain select gate form a Schottky junction.

8. The semiconductor memory device of claim 2, wherein the source layer includes N type doped polysilicon.

9. A semiconductor memory device, comprising:
   a stack structure; and
   a channel structure passing through the stack structure,
   wherein the channel structure includes a channel layer passing through the stack structure and a memory layer surrounding the channel layer,
   the stack structure includes a drain select gate contacting the channel layer, and
   the channel layer and the drain select gate configured to form a Schottky junction,
   wherein the drain select gate and the channel layer are in direct contact with each other.

10. The semiconductor memory device of claim 9, further comprising:
    a bit line electrically coupled to the channel structure.

11. The semiconductor memory device of claim 9, wherein a level of a top portion of the memory layer is lower than a level of a bottom portion of the drain select gate.

12. The semiconductor memory device of claim 9,
    wherein the stack structure further includes gate patterns and insulating patterns stacked alternately with each other, and
    wherein a length of the drain select gate in a vertical direction is greater than a length of the gate pattern in the vertical direction.

13. The semiconductor memory device of claim 9, wherein a work function of a material included in the drain select gate is greater than a work function of a material included in the channel layer.

14. The semiconductor memory device of claim 13, wherein the drain select gate includes at least one of iron (Fe), chromium (Cr), molybdenum (Mo), copper (Cu), cobalt (Co), gold (Au), palladium (Pd), nickel (Ni), platinum (Pt), cobalt monosilicide (CoSi), nickel monosilicide (NiSi), tungsten monosilicide (WSi) and platinum monosilicide (PtSi).

15. The semiconductor memory device of claim 10,
    wherein the channel structure further includes a conductive pad between the bit line and the channel layer, and
    wherein the conductive pad includes N type doped polysilicon.

16. A semiconductor memory device, comprising:
    a source layer;
    a stack structure on the source layer; and
    a channel structure passing through the stack structure; and
    a bit line electrically coupled to the channel structure,
    wherein the channel structure includes a channel layer passing through the stack structure and a memory layer surrounding the channel layer,
    the stack structure includes a source select gate contacting a lower portion of the channel layer and a drain select gate contacting an upper portion of the channel layer,
    the channel layer and the source select gate are configured to form a Schottky junction, and
    the channel layer and the drain select gate are configured to form a Schottky junction, and wherein the source select gate and the channel layer are in direct contact with each other, and the drain select gate and the channel layer are in direct contact with each other.

17. The semiconductor memory device of claim 16, wherein a work function of a material included in the source select gate and a work function of a material included in the drain select gate are greater than a work function of a material included in the channel layer.

18. The semiconductor memory device of claim 16, wherein the memory layer is disposed between the source select gate and the drain select gate.

19. The semiconductor memory device of claim 16,
wherein the channel layer includes a first depletion region contacting the source select gate and a second depletion region contacting the drain select gate, and
wherein each of the first depletion region and the second depletion region has a ring shape.

* * * * *